US011716825B2

(12) United States Patent
Gartenlaub et al.

(10) Patent No.: US 11,716,825 B2
(45) Date of Patent: Aug. 1, 2023

(54) BLIND-MATED POWER DISTRIBUTION UNITS

(71) Applicant: MELLANOX TECHNOLOGIES, LTD., Yokneam (IL)

(72) Inventors: Ohad Gal Gartenlaub, Alonei Abba (IL); Roy Kauffman, Gilon (IL); Alex Kremenetsky, Kiriat Bialik (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 11 days.

(21) Appl. No.: 17/333,294

(22) Filed: May 28, 2021

(65) Prior Publication Data

US 2022/0385045 A1 Dec. 1, 2022

(51) Int. Cl.
*H05K 7/14* (2006.01)
*H01R 25/00* (2006.01)

(52) U.S. Cl.
CPC ......... *H05K 7/1438* (2013.01); *H01R 25/006* (2013.01); *H05K 7/1457* (2013.01)

(58) Field of Classification Search
CPC ... H05K 7/1438; H05K 7/1457; H01R 25/006
See application file for complete search history.

(56) References Cited

U.S. PATENT DOCUMENTS

| 6,482,046 B1* | 11/2002 | Salinas | H01R 13/506 |
| | | | 439/923 |
| 2018/0159283 A1* | 6/2018 | Garcia | H01R 25/006 |
| 2022/0102966 A1* | 3/2022 | Tan | G01R 31/006 |
| 2022/0271513 A1* | 8/2022 | Arduini | H02B 1/04 |

OTHER PUBLICATIONS

"PX® Intelligent Rack PDUS," Raritan Inc., Nov. 2020, V1186R11, 8 pages.

* cited by examiner

*Primary Examiner* — Michael C Zarroli
(74) *Attorney, Agent, or Firm* — Sheridan Ross P.C.

(57) ABSTRACT

A power distribution unit (PDU) comprises a housing, an input on the housing, and an input connector coupled to the input on the housing. The input connector is connectable to a power source that provides power for distribution by the PDU to one or more power consuming devices. The PDU includes an output including output connectors that provide blind-mate connection with a connection interface coupled to the one or more power consuming devices.

20 Claims, 11 Drawing Sheets

BLIND-MATED POWER DISTRIBUTION UNITS

FIELD OF THE DISCLOSURE

The present disclosure is generally directed to blind-mated power distribution units, and more particularly, to blind-mated power distribution units for networking systems.

BACKGROUND

Power distribution units (PDUs) are used to distribute power to power consuming devices in an electronic system. One example application for PDUs is in the networking field where a PDU distributes power to power consuming devices within a network device. In this case, the power consuming devices may include power supply units for network switches within the network device. As the number of power consuming devices within a network device becomes larger, so too does the number of cables used to connect the PDU with the power consuming devices, which leads to complex cable routing and/or time-consuming replacement and/or repair of the PDU.

BRIEF SUMMARY

In an illustrative embodiment, a power distribution unit (PDU) comprises a housing, an input on the housing, and an input connector coupled to the input on the housing. The input connector is connectable to a power source that provides power for distribution by the PDU to one or more power consuming devices. The PDU includes an output including output connectors that provide blind-mate connection with a connection interface coupled to the one or more power consuming devices.

In another illustrative embodiment, a system comprises network elements that provide networking functions, power supply units that supply power to the network elements, and a removable power distribution unit (PDU). The PDU includes a housing, an input connector external to the housing and that detachably connects with a power source that provides power for distribution by the PDU to the power supply units, and output connectors located on the housing and that provide blind-mate connection with the power supply units.

In another illustrative embodiment, a PDU comprises a housing, an input connector external to the housing and that detachably connects with a power source that provides power for distribution by the PDU to one or more consumers, and output connectors located on the housing that blind-mate with a backplane coupled to the consumers.

Additional features and advantages are described herein and will be apparent from the following description and the figures.

BRIEF DESCRIPTION OF THE DRAWINGS

The present disclosure is described in conjunction with the appended figures, which are not necessarily drawn to scale.

DETAILED DESCRIPTION

Figure 1:
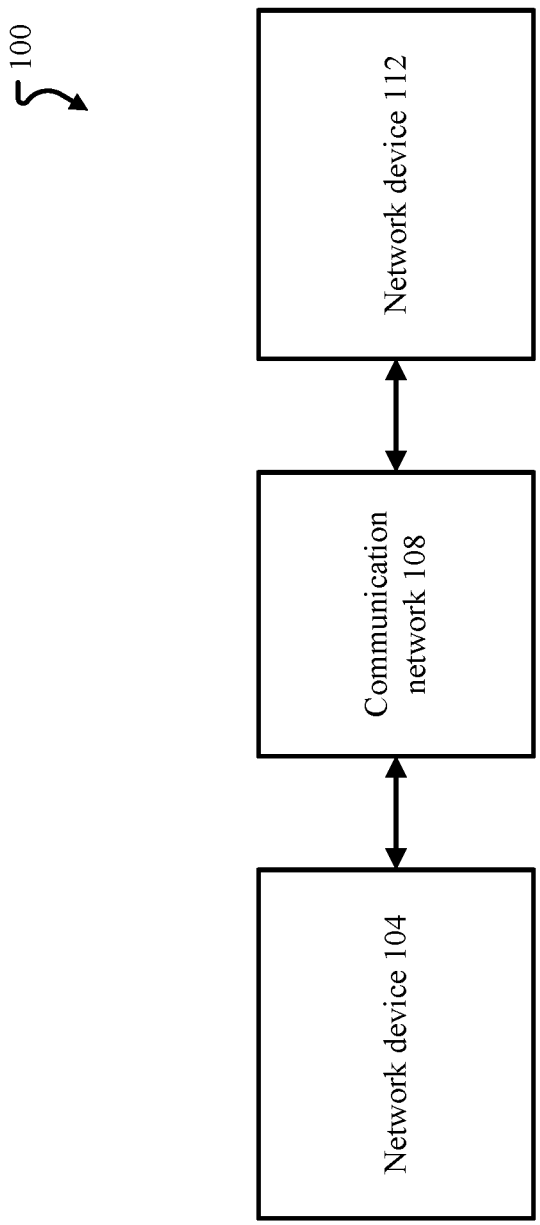
FIG. 1 illustrates a block diagram of a networking system according to at least one example embodiment.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

It will be appreciated from the following description, and for reasons of computational efficiency, that the components of the system can be arranged at any appropriate location within a distributed network of components without impacting the operation of the system.

Furthermore, it should be appreciated that the various links connecting the elements can be wired, traces, or wireless links, or any appropriate combination thereof, or any other appropriate known or later developed element(s) that is capable of supplying and/or communicating data to and from the connected elements. Transmission media used as links, for example, can be any appropriate carrier for electrical signals, including coaxial cables, copper wire and fiber optics, electrical traces on a PCB, or the like.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The terms "determine," "calculate," and "compute," and variations thereof, as used herein, are used interchangeably and include any appropriate type of methodology, process, operation, or technique.

Various aspects of the present disclosure will be described herein with reference to drawings that may be schematic illustrations of idealized configurations.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "including," "includes," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Example embodiments are directed to blind-mated, field replaceable PDU modules for power delivery to consumers (e.g., for AC power delivery to AC/DC power supply units). Related art PDUs employ long power strips that require assembly of many cables and cannot be replaced without shutting down every device connected to the PDU. Other related art systems may employ an electrical cabinet, which requires handling by a certified electrician in case of failed-part replacement or maintenance.

Among other things, PDUs or PDU modules according to example embodiments provide a compact design with cable-free connection to power consuming devices of a network switch and are replaceable within a larger system without shutting down and disassembling the network switch's chassis. In addition, replacement of a PDU module does not require special training or knowledge.

A PDU according to inventive concepts distributes power from a power source to multiple power consuming devices and may employ circuit breakers. A PDU according to inventive concepts may also include remote controlled relays for remote reboot capability of the PDU outputs. The output connectors of the PDU are blind-mate connected with, for example, a backplane coupled to the power consuming devices, which allows a direct power feed to the backplane. The PDU may be designed to slide into and out of a larger system and uses a single connection of the input plug to the power source.

Blind-mated PDU modules according to example embodiments provide a compact, high-density, field replaceable solution that may be inserted directly into a power backplane, thereby eliminating the need for cable routing.

FIG. 1 illustrates a system 100 according to at least one example embodiment. The system 100 includes a network device 104, a communication network 108, and a network device 112. In at least one example embodiment, network devices 104 and 112 may correspond a network switch (e.g., an Ethernet switch), a network interface controller (NIC), or any other suitable device used to control the flow of data between devices connected to communication network 108. Each network device 104 and 112 may be connected to one or more of Personal Computer (PC), a laptop, a tablet, a smartphone, a server, a collection of servers, or the like. In one specific, but non-limiting example, each network device 104 and 112 includes multiple network switches in a fixed configuration or in a modular configuration.

Examples of the communication network 108 that may be used to connect the network devices 104 and 112 include an Internet Protocol (IP) network, an Ethernet network, an InfiniBand (IB) network, a Fibre Channel network, the Internet, a cellular communication network, a wireless communication network, combinations thereof (E.g., Fibre Channel over Ethernet), variants thereof, and/or the like. In one specific, but non-limiting example, the communication network 108 is a network that enables communication between the network devices 104 and 112 using Ethernet technology.

Although not explicitly shown, the network device 104 and/or the network device 112 may include storage devices and/or processing circuitry for carrying out computing tasks, for example, tasks associated with controlling the flow of data within each network device 104 and 112 and/or over the communication network 108. Such processing circuitry may comprise software, hardware, or a combination thereof. For example, the processing circuitry may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally or alternatively, the processing circuitry may comprise hardware, such as an application specific integrated circuit (ASIC). Other non-limiting examples of the processing circuitry include an Integrated Circuit (IC) chip, a Central Processing Unit (CPU), a General Processing Unit (GPU), a microprocessor, a Field Programmable Gate Array (FPGA), a collection of logic gates or transistors, resistors, capacitors, inductors, diodes, or the like. Some or all of the processing circuitry may be provided on a Printed Circuit Board (PCB) or collection of PCBs. It should be appreciated that any appropriate type of electrical component or collection of electrical components may be suitable for inclusion in the processing circuitry.

In addition, although not explicitly shown, it should be appreciated that the network devices 104 and 112 include one or more communication interfaces for facilitating wired and/or wireless communication between one another and other unillustrated elements of the system 100.

As discussed in more detail below, each network device 104 and 112 may include or be connected to a power distribution unit (PDU) that supplies power to power consuming elements of the network devices 104 and 112 (e.g., to the individual network switches within each network device). Related art PDUs may take the form of many power interfaces (e.g., AC and/or DC power outlets) integrated into a single power strip, which requires cumbersome power cable routing and complicated assembly/disassembly. In addition, these power strips cannot be easily replaced. For example, replacement or repair of one or a few of the outlets of the PDU or other elements of the PDU may require powering off the entire strip and disconnecting each power cable before installing a new power strip and reconnecting the power cables to each outlet. This process is time consuming and may result in unnecessary replacement of functioning parts of the PDU that are integrated with non-functioning parts of the PDU. In order to address these and other shortcomings of the related art, example embodiments provide PDUs capable of blind-mating or direct connection with power consuming elements within the network devices 104 and/or 112. In addition, PDUs according to example embodiments may be modular and function together to provide power to consumers so that replacement or repair of one non-functioning PDU module does not interrupt power to consumers of the network device connected to functioning PDU modules.

Figure 2:
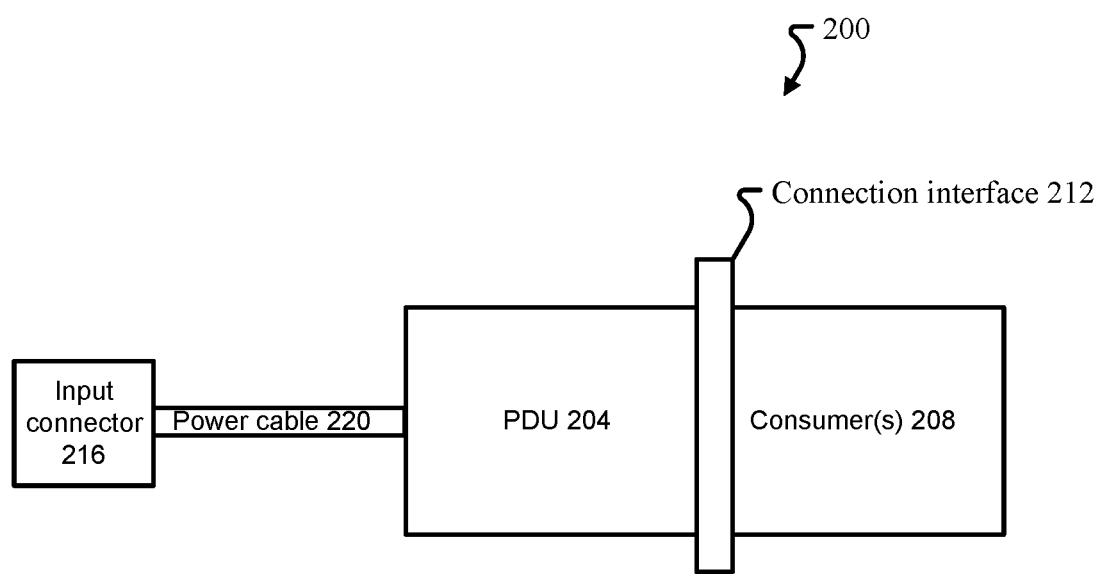
FIG. 2 illustrates a block diagram of a power system according to at least one example embodiment.

FIG. 2 illustrates a block diagram of a power system 200 according to at least one example embodiment. The power system 200 may be integrated with and/or connected to the network devices 104 and 112 to distribute power to one or more consumers 208 within the network devices 104 and 112. In one non-limiting example, each network device 104 and 112 includes a collection of PDUs 204 that distribute power to consumers 208.

As shown in FIG. 2, the power system 200 includes a PDU 204 (also referred to as a PDU module 204), one or more consumers 208, a connection interface 212, an input connector 216 and a power cable 220.

The PDU 204 may include hardware and/or software for distributing power to consumers 208. An example structure of the PDU 204 is shown and described with reference to FIGS. 3-11 below.

The one or more consumers 208 may include one or more power consuming devices. In one example, the consumers 208 include power supply units (PSUs) that supply power to various elements of the network devices 104 and 112. In this case and when the network devices 104 and 112 are embodied by a collection of network switches, the PSUs may include hardware and/or software for providing alternating current (AC) and/or direct current (DC) power to devices within or connected to the network switches, such as NICs, GPUs, CPUs, and/or other devices suited for inclusion in a networking environment (see FIG. 11). However, example embodiments are not limited to the consumers 208 being PSUs and the consumers 208 may include any suitable power consuming device for a network device 104 and 112 (e.g., a power consuming element that does not use a dedicated PSU). In addition, example embodiments are not limited to employing the power system 200 in a networking system, and the power system 200 may be implemented in any suitable electrical system where blind-mated and field-replaceable PDUs are useful.

The connection interface 212 may facilitate electrical connection and/or mechanical connection of the PDU 204 to the consumers 208. In one non-limiting example, the connection interface 212 is an electrical backplane integrated with the consumers 208 that electrically and mechanically connects with the PDU 204. In at least one example embodiment, the electrical and/or mechanical connection of the PDU 204 to the consumers 208 is a blind-mate connection. The blind-mate connection between the PDU 204 and the connection interface 212 may be achieved by a suitable mating action, such as sliding action, snapping action, friction fit, and/or the like. In at least one other embodiment, the connection interface 212 is a physically separate interface from the PDU 204 and the consumers 208. In this case, the connection interface 212 may have input connectors that blind-mate connect to the PDU 204 and output connectors that connect (blind-mate or not) to the consumers 208.

The input connector 216 may include a suitable electromechanical connector that electrically and mechanically connects with a corresponding connector of an external power source (not shown) in order to provide electrical power to be distributed by the PDU 204 to the consumers 208. The power cable 220 may include one or more wirings that carry AC power signals from the input connector 216 to the PDU 204. For example, the power cable 220 may include suitable hardware (e.g., wiring) to carry one phase, two phase, and/or three phase AC power signals of prespecified voltages (e.g., 120V, 240V, and/or the like) and frequencies (60 Hz, 120 Hz, and/or the like). However, example embodiments are not limited thereto, and the input connector 216, the power cable 220, and the PDU 204 may be configured to receive and distribute DC power.

Figure 4:
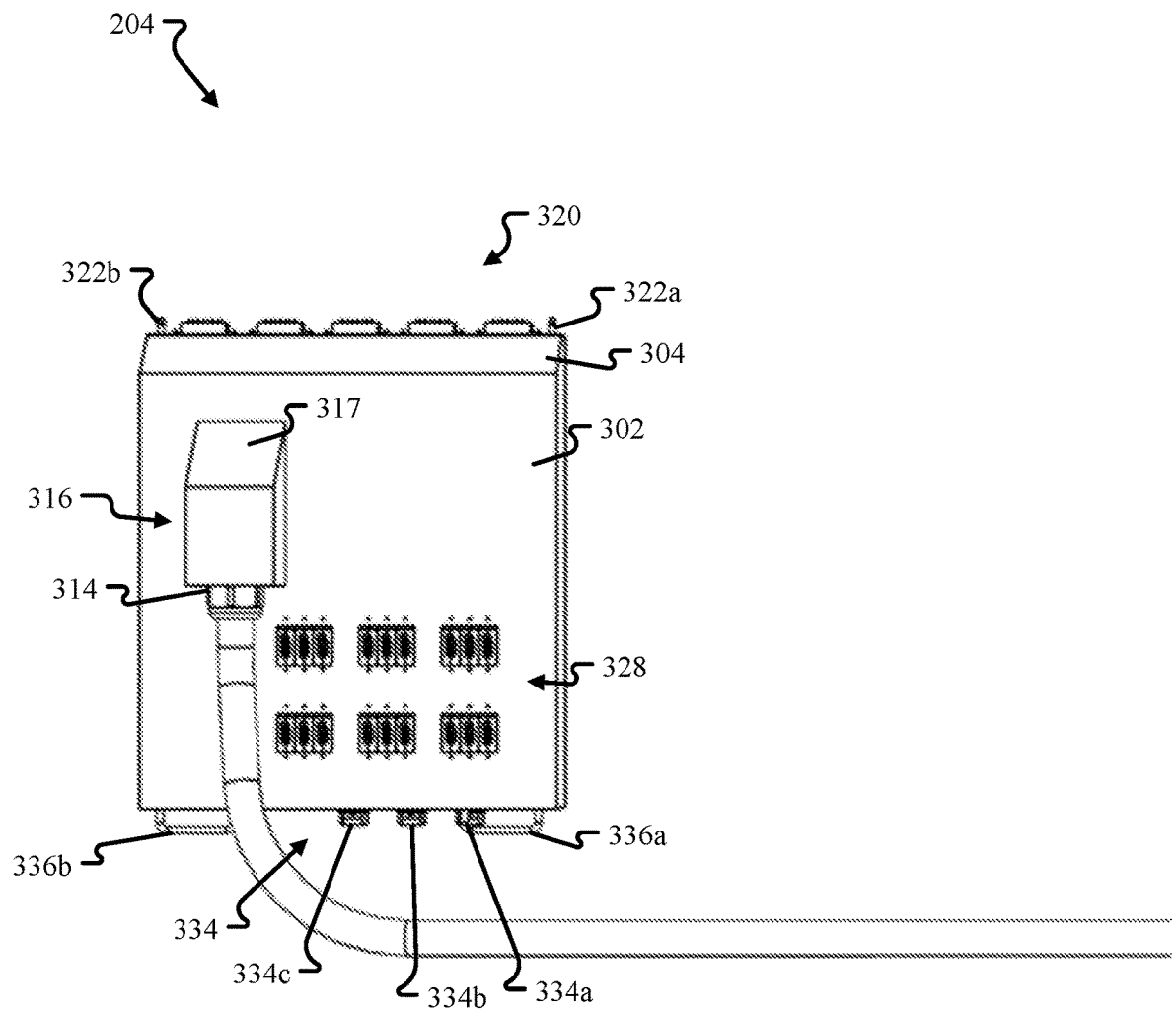
FIG. 4 illustrates another view of the PDU in FIG. 3 according to at least one example embodiment.
Figure 5:
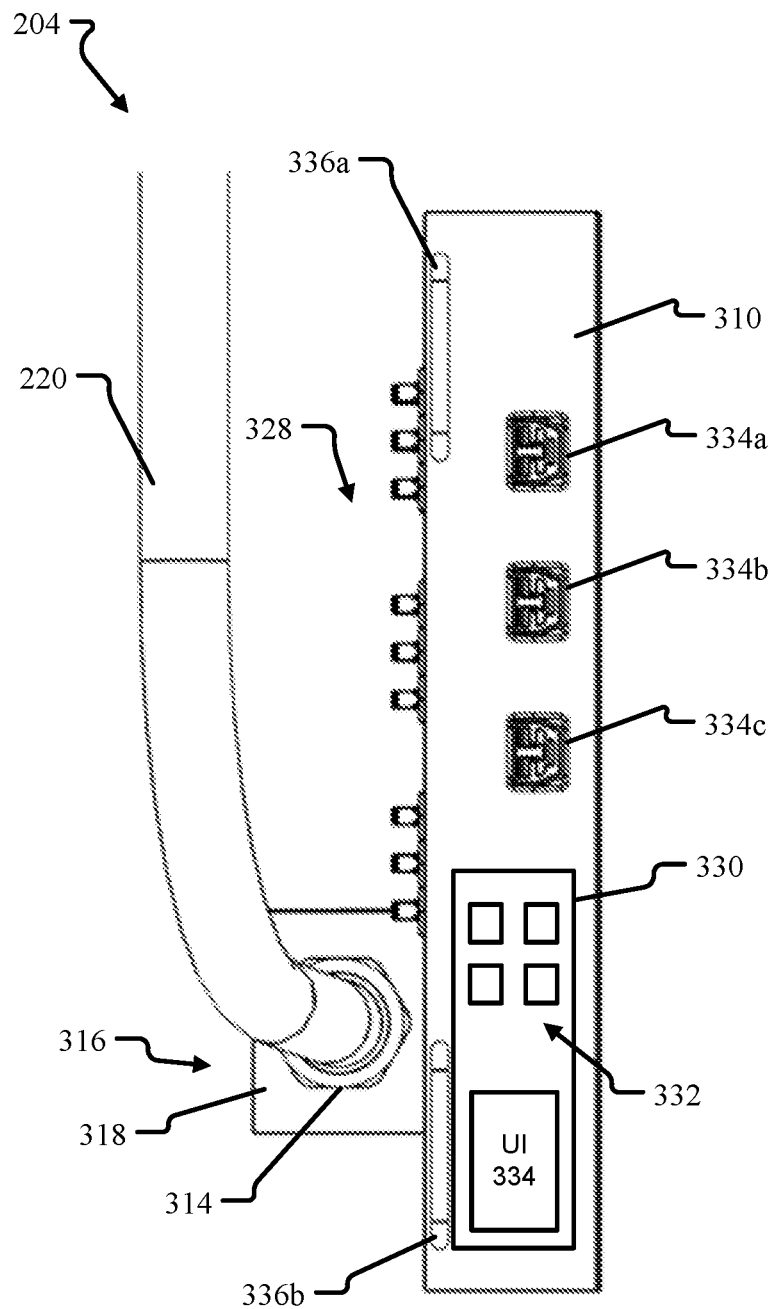
FIG. 5 illustrates another view of the PDU in FIG. 3 according to at least one example embodiment.
Figure 6:
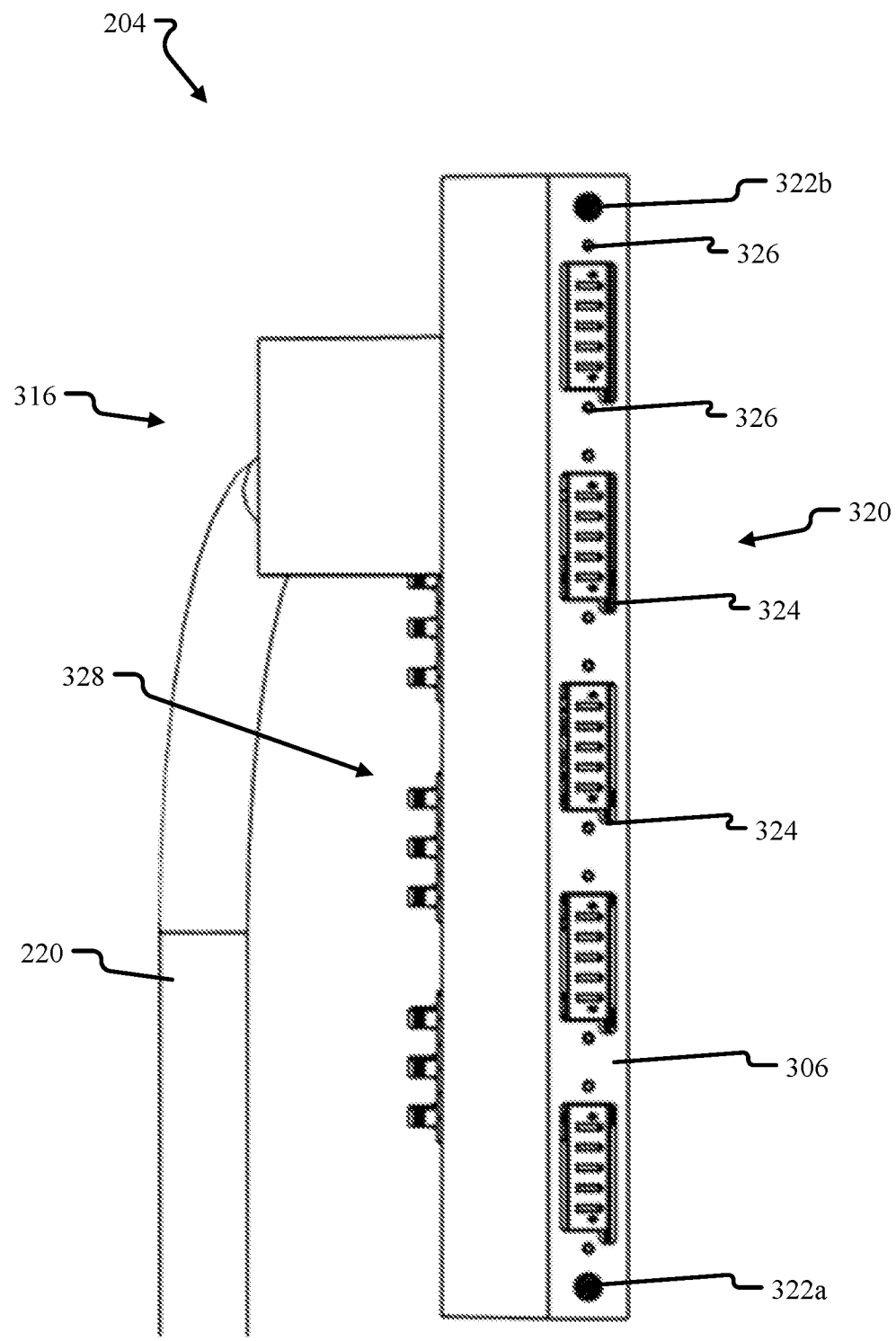
FIG. 6 illustrates another view of the PDU in FIG. 3 according to at least one example embodiment.
Figure 7:
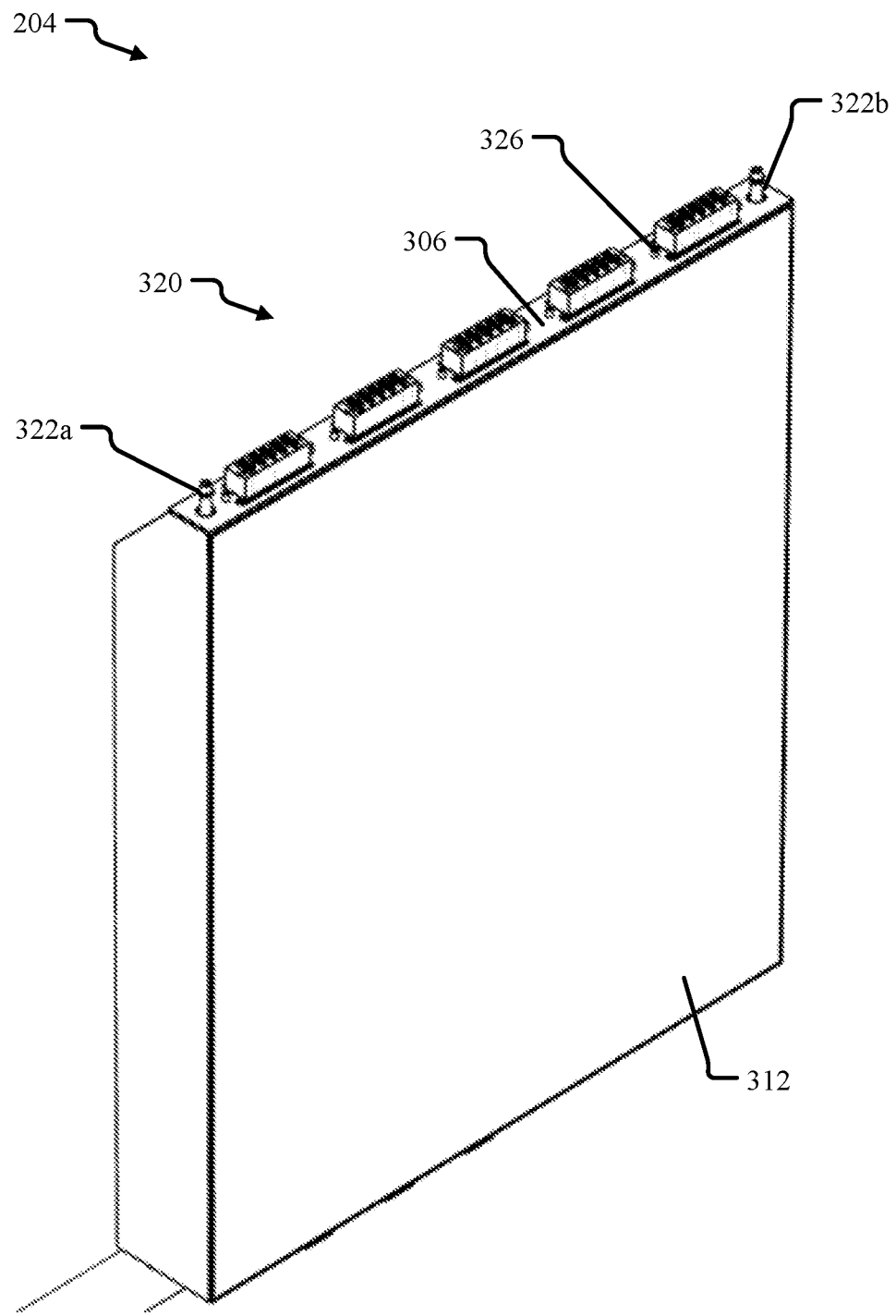
FIG. 7 illustrates another view of the PDU in FIG. 3 according to at least one example embodiment.
Figure 8:
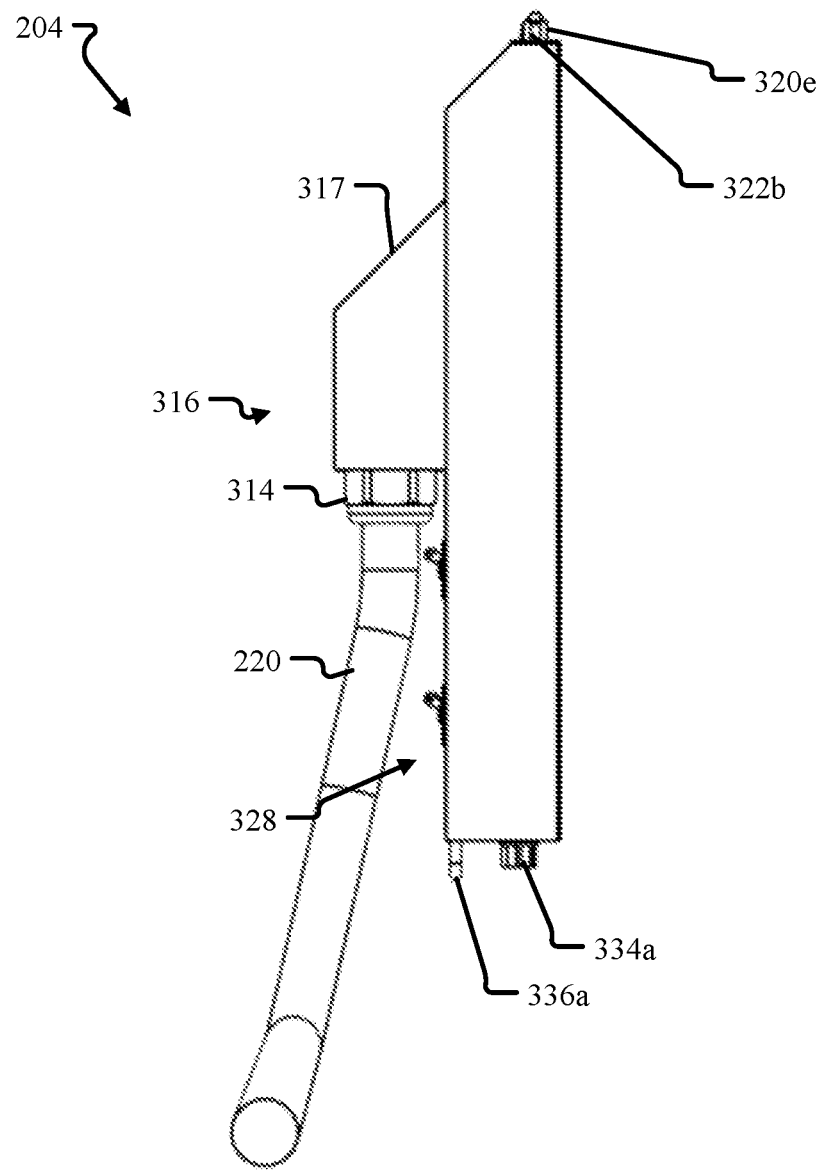
FIG. 8 illustrates another view of the PDU in FIG. 3 according to at least one example embodiment.
Figure 9:
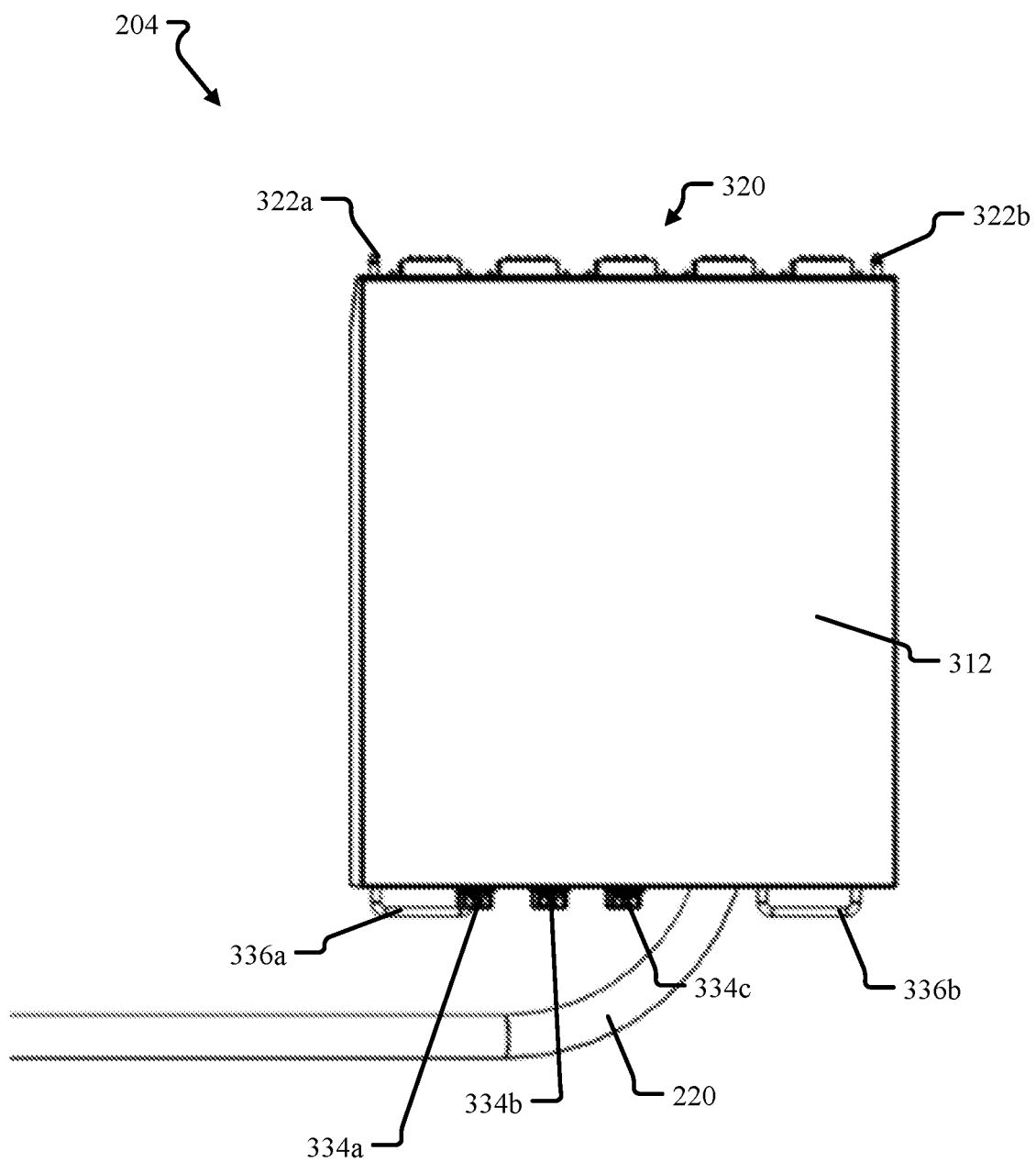
FIG. 9 illustrates another view of the PDU in FIG. 3 according to at least one example embodiment.

The structure of the PDU 204 will now be described in more detail below with reference to FIGS. 3-11, which illustrate various views of the PDU 204. Initially, details of the PDU 204 are shown with reference to FIGS. 3-9, where FIG. 3 illustrates a back perspective view of the PDU 204, FIG. 4 illustrates a side view of the PDU 204, FIG. 5 illustrates a frontend view of the PDU 204, FIG. 6 illustrates a backend view of the PDU 204, FIG. 7 illustrates a side perspective view of the PDU 204, FIG. 8 illustrates another side view of the PDU 204, and FIG. 9 illustrates a side plan view of the PDU 204.

With reference to FIGS. 3-9, the PDU 204 includes a housing 300 with surfaces or faces 302, 304, 306, 308, 310, and 312. The PDU 204 includes an input 314 on the housing 300. In the example structure of FIGS. 3-9, the housing 300 includes a protrusion 316 that protrudes from surface 302 and the input 314 is located on the protrusion 316. For example, the input 314 is located on a sidewall 318 of the protrusion 316. The protrusion 316 and the housing 300 may have angled surfaces 317 and 304, respectively, which may be useful in applications where the PDU 204 is placed in an environment with airflow. For example, in a scenario where the consumers 208 include PSUs that require cooling, then the angled surfaces 304 and 317 may ease the flow of air that cools the PSUs over the housing 300, where the direction of airflow is substantially perpendicular to the surface 306 of the housing 300 (see FIG. 11). However, example embodiments are not limited thereto, and the angled surfaces 304 and/or 317 may be straight edges instead so that the body of the housing 300 and/or the protrusion are cuboids.

Figure 11:
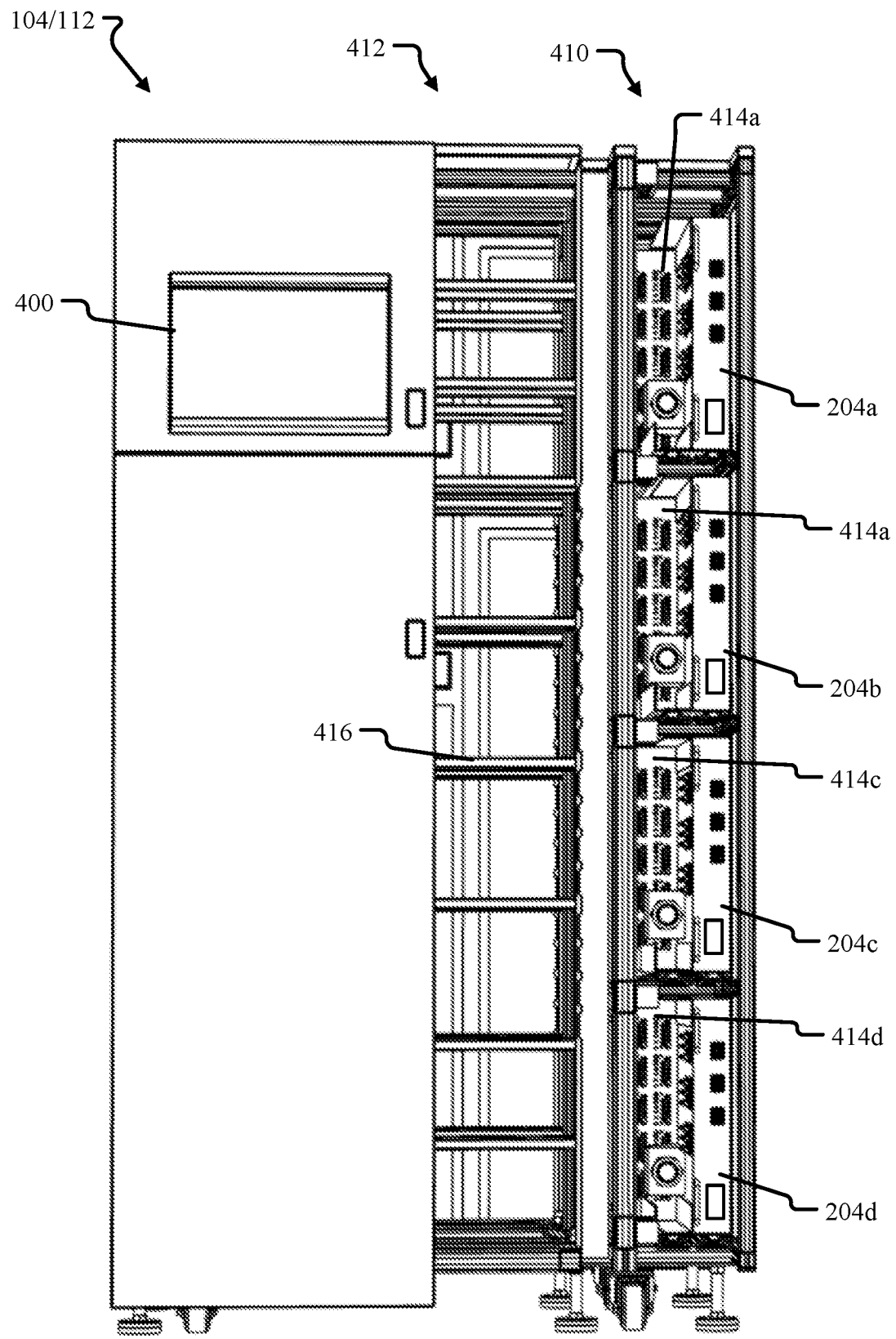

In at least one example embodiment, placing the input 314 on the sidewall 318 of the protrusion 316 provides for easy insertion and removal of the PDU 204 from the connection interface 212 and/or enables a convenient path for the cable 220 to exit a network device 104 or 112 (see FIG. 11). However, example embodiments are not limited to the location of the input 314 shown in FIGS. 3-9, and the input 314 may be formed at another location on the housing 300 with or without being located on a protrusion. For example, the input 314 may be located on the surface 310 of the housing 300 without using a protrusion. In at least one embodiment, the input 314 may be located within a recess formed within a surface of the housing 300, for example, surface 302. In this case, the surface 302 may include an angled recess formed therein where the input 314 is on a wall that defines an end of the angled recess.

Figure 3:
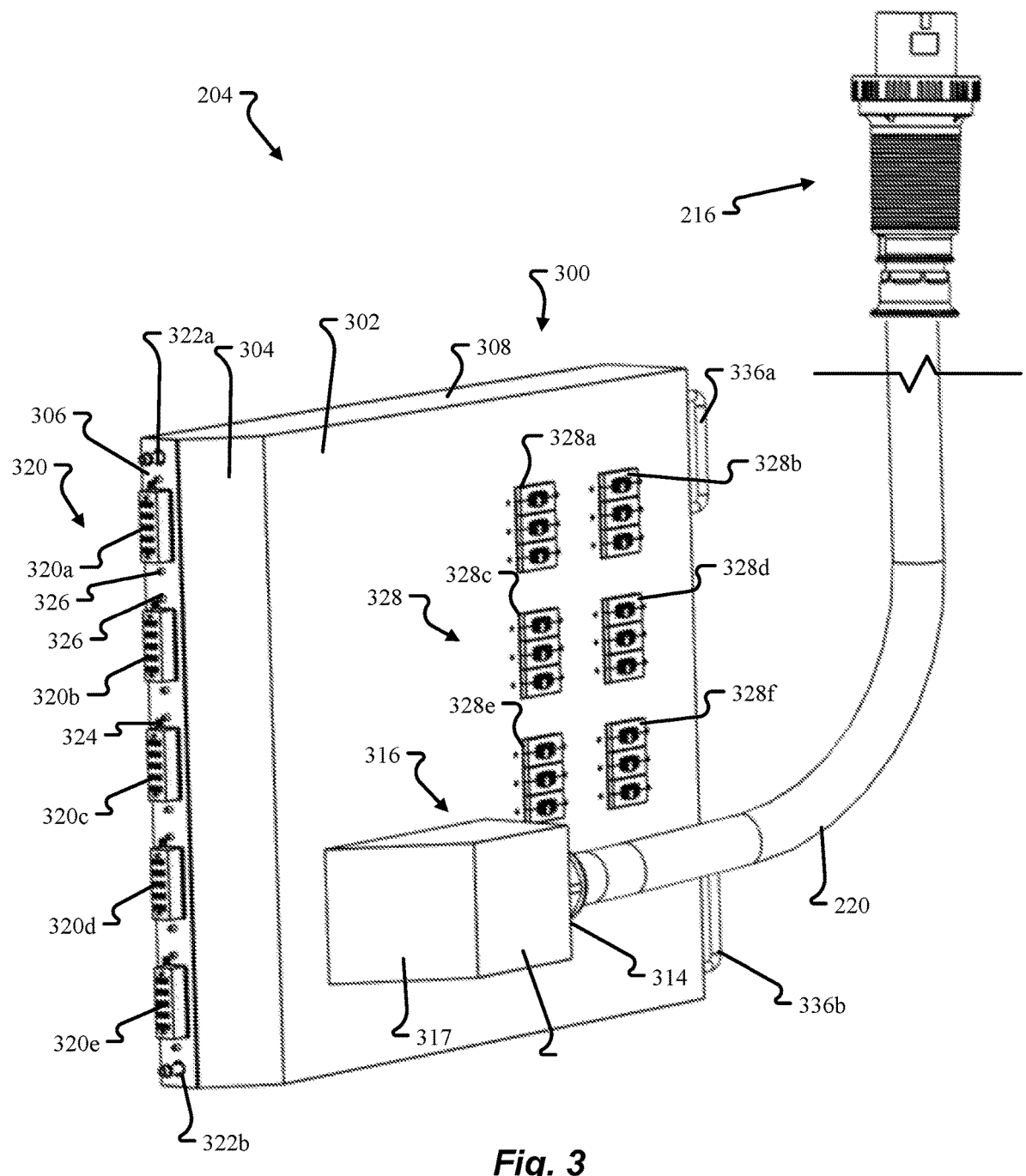
FIG. 3 illustrates a view of a PDU according to at least one example embodiment.

As shown in FIG. 3, for example, the input connector 216 is external to the housing 300 and is coupled to the input 314 on the housing 300, for example, by the power cable 220. As noted above, the input connector 216 connectable to a power source (not shown) that provides power for distribution by the PDU 204. Thus, a length of the power cable 220 may vary according to design preferences.

As further shown, the PDU 204 includes an output, which may refer to one or more devices associated with outputting power distributed by the PDU 204. Thus, the output includes output connectors 320 on a surface 306 of the housing 300. The output connectors 320a to 320e provide blind-mate connection to distribute the power. For example, the output connectors 320a to 320e provide blind-mate connection to the connection interface 212, which may be embodied as an electrical backplane coupled to consumers 208. In general, the output connectors 320 have a structure (e.g., size, shape, number and configuration of electrical contacts) that conforms to the form factor of the design (e.g., the form factor of the connection interface 212 and/or the consumers 208). FIGS. 3-9 illustrate an example where the output connectors 320 are male connectors that blind-mate connect with corresponding female connectors of the connection interface 212. However, example embodiments are not limited thereto, and the output connectors 320 may be female connectors that blind-mate connect with corresponding male connectors of the connection interface 212 if desired.

Five output connectors 320 are depicted in FIGS. 3-9, but more or fewer output connectors 320 may be included according to design preferences. For example, the number of output connectors 320 may match the number of consumers 208 that receive power from the PDU 204 and/or match the number of ports of the connection interface 212. As shown, the output connectors 320 are located at a back face of the housing 300 (i.e., surface 306). As noted above, the back face of the housing 300 includes an angled surface 304 that slopes away from the output connectors 320 in a direction toward the input 314 on the housing 300.

As shown in FIG. 5, the output may further include one or more auxiliary output connectors 334*a* to 334*c* exposed at a surface 310 of the housing 300 and that provide further distribution of the power to, for example, one or more consumers 208 that are not integrated with the connection interface 212 or otherwise not able to receive power through the connection interface 212. The type of auxiliary output connector 334*a* to 334*c* may vary according to design preferences, for example, according to a type of power signal used by a device connected to an auxiliary output connector. For example, in one embodiment, the auxiliary output connectors 334 comprise traditional AC and/or DC power outlets. Here, it should be appreciated that more or fewer auxiliary output connectors 334 may be included if desired, and a location of the auxiliary output connectors 334 on the housing 300 may vary according to design preferences.

The surface 306 of the housing 300 may further include guides 322*a*/322*b*, 324, and/or 326 that facilitate blind-mate connection of the output connectors 320 to the connection interface 212. The guides 322*a* and 322*b* are at opposing ends of the surface 306. Each connector 320*a* to 320*e* may include a guide 324 (only one guide 324 labeled in FIG. 3) at one end to further assist with aligning each connector 320 to a corresponding connector of the connection interface 212. The surface 306 may still further include two guides 326 for each connector 320. The guides 326 for each connector 320 are located on the surface 306 at opposing ends of the connector 320. More or fewer guides 322, 324, and/or 326 may be included according to design preferences. In addition, the guides 322, 324, and 326 are depicted as protrusions in particular locations, but example embodiments are not limited thereto and the guides 322, 324, and 326 may be embodied as recesses and the locations of guides 322, 324, and 326 may vary according to design preference.

In addition to assisting with alignment of the PDU 204 with the connection interface 212, the guides 322, 324, and/or 326 may further contribute to the mechanical connection of the PDU 204 to the connection interface 212. For example, one or more of the guides 322, one or more of the guides 324, and/or one or more of the guides 326 may be magnetic in order to magnetically engage with corresponding magnets on the connection interface 212 and/or may have certain shapes to snap fit with or otherwise physically engage with corresponding shapes on the connection interface 212, and/or the like.

The PDU 204 includes a collection of circuit breakers 328. The circuit breakers 328 may include sets of circuit breakers 328*a* to 328*f*. The circuit breakers 328 may be coupled between the input 314 and the output of the PDU 204 (e.g., output connectors 320) and include hardware that provides current and/or voltage overload protection for the consumers 208. As shown, the circuit breakers 328 are externally accessible to a user in that switching mechanisms of the circuit breakers 328 protrude from surface 302 of housing 300. The circuit breakers 328 provide overcurrent and/or overvoltage protection for the five output connectors 320*a* to 320*e* and/or the auxiliary output connectors 334. As shown in FIG. 3, for example, each set of circuit breakers 328*a* to 328*f* includes three breakers, however, example embodiments are not limited thereto and the number of breakers in each set of circuit breakers as well as the number of sets of circuit breakers may vary according to design preferences (e.g., according to a number of phases of the power signal input to input 314, according to a number of output connectors and/or auxiliary output connectors, and/or the like).

As shown in FIG. 5, for example, the PDU 204 includes a controller 330, which may be mounted in the housing 300 and including one or more interfaces 332 exposed at a surface of the housing 300 to allow access to the controller 330. The controller 330 may include suitable hardware and/or software for controlling distribution of power by the PDU 204 and/or for monitoring the PDU 204 and/or devices connected to the PDU 204. The interfaces 332 may include communication interfaces that enable communication with one or more external devices. For example, the interfaces 332 may include an Ethernet port, a port that connects to an external device that enables a user to program the controller 330, and/or the like. Although not explicitly shown, the controller 330 may include one or more wireless communication interfaces for wireless communication (e.g., Wi-Fi, Bluetooth, near field communication (NFC), cellular, and/or the like) to allow remote control of the PDU 204. Such remote control may include but is not limited to a system administrator sending an instruction to the PDU 204 to reset the circuit breakers 328 or otherwise reboot the PDU 204.

As further shown in FIG. 5, the controller 330 includes a user interface (UI) 334, which may comprise a digital display and/or one or more input devices (e.g., touch-sensitive areas of the display or physical buttons) that enable user input to the PDU 204. The UI 334 may display various information about the PDU 204 and/or about devices connected to the PDU 204. Such information may include status information of the PDU 204 and/or of devices connected to the PDU 204. Status information may include but is not limited to information related to an operating status of the PDU 204 (e.g., whether a particular port is functioning properly or not, whether a particular device connected to the PDU 204 is functioning properly or not, maintenance information, temperature information, and/or the like).

The PDU 204 includes handles 336*a* and 336*b* attached to the surface 310 of the housing 300. The handles 336*a* and 336*b* may facilitate installation and removal of the PDU 204 into and out of a network device 104 or 112 by a technician or user. Here, it should be appreciated that the number and location of the handles 336 may vary according to design preferences.

Figure 10:
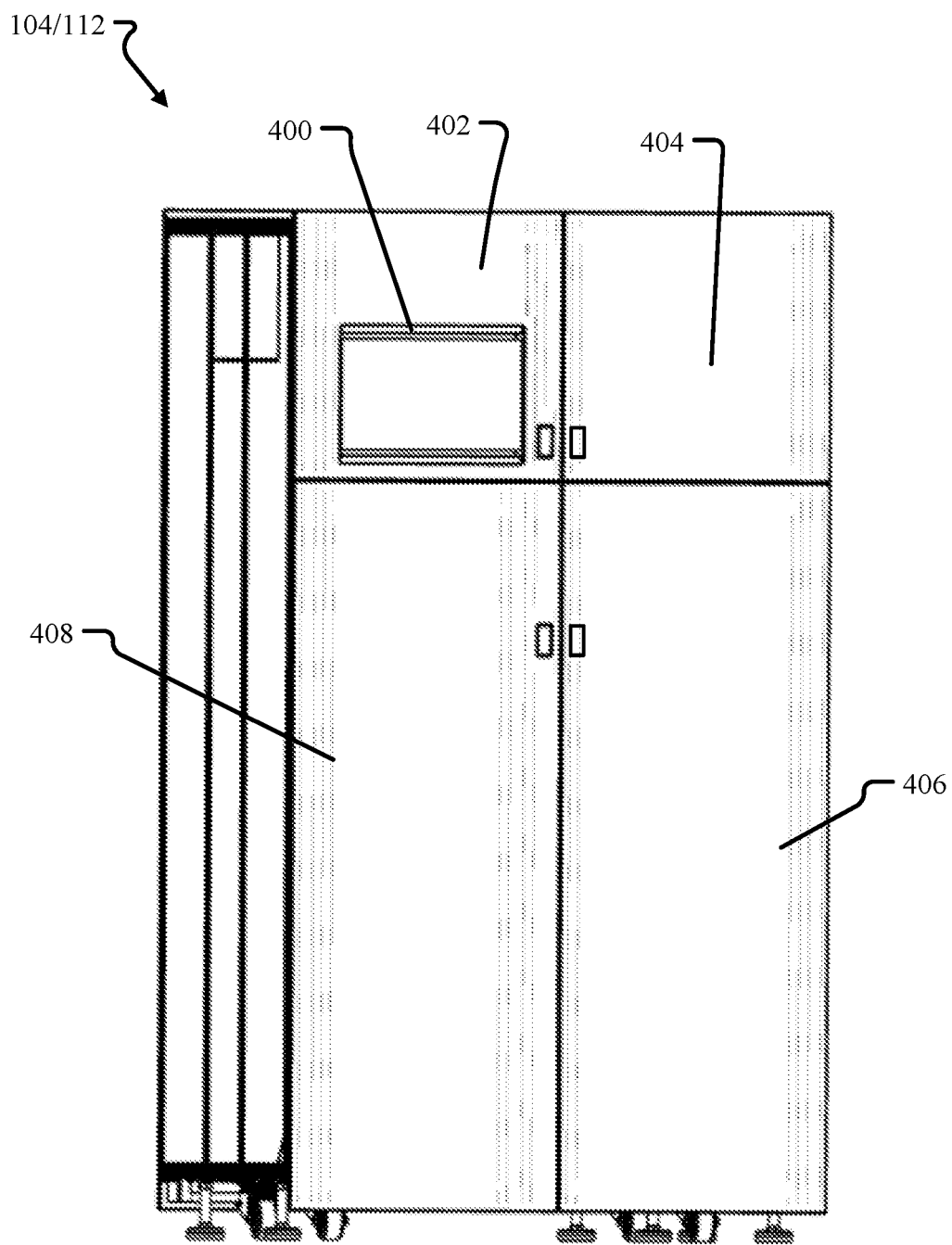
FIGS. 10 and 11 illustrate views of an example network device according to at least one example embodiment.

FIGS. 10 and 11 illustrate an example of a network device 104 and 112. The network device may take the form of a cabinet that includes a user interface 400 and doors 402, 404, 406, and 408. The user interface 400 may comprise a display, one or more communication interfaces for wired and/or wireless communication with other devices, and one or more input devices that enable a user to interact with the display. As shown in FIG. 11 where doors 404 and 406 are hidden, the network device 104 or 112 may include a power supply section 410 and a networking section 412.

The power supply section 410 may include PDUs 204*a* to 204*d* and PSUs 414*a* to 414*d*. The PDUs 204*a* to 204*d* may have the same or similar structure as shown and described with reference to the PDU 204 of FIGS. 1 to 9 to blind-mate connect with corresponding connectors of the PSUs 414 (i.e., the connection interface 212). FIG. 11 illustrates an example where each PSU 414a to 414d is connected to a respective PDU 204. In one embodiment, a single PDU 204 may be constructed to have a number of output connectors 320 that matches the number of corresponding connectors of a PSU 414. For example, FIG. 11 illustrates an example where each PSU 414 has 15 connectors (e.g., single phase connectors), and thus, a single PDU 204 may be constructed to also have 15 output connectors 320 (e.g., single phase connectors) arranged in a manner that will align and blind-mate with the connectors of the PSU 414 (e.g., the PDU 204 has three columns of five output connectors 320). In another embodiment, PSUs are connected to a power board that exists between the PSUs and a PDU, where the board includes 15 single phase connectors on one side that are connected to respective ones of 15 single phase PSUs and where the board includes 5 three phase connectors on the other side that blind-mate with a single PDU 204 so that each three phase connector feeds three single phase connectors. Although not explicitly illustrated, it should be appreciated that cables 220 for each PDU 204 in the power supply section 410 may be arranged so as to exit from a top of the cabinet in order to allow the input connector 216 of each cable 220 to be connected to a power source.

The PSUs 414 may provide power to one or more network switches or other power consuming devices (not shown) arranged on racks 416 in the networking section 412. As explained above, in addition to providing blind-mate connection with a power consumer for convenient installation and removal of PDUs 204, certain features of the structure of the PDUs 204 are useful for the network device implementation in FIGS. 10 and 11. For example, the locations of the controller 330, handles 336a and 336b, auxiliary output connectors 334a to 334c, and circuit breakers 328 are easily accessible to a user through doors 404 and 406. In addition, the angled surfaces 304 and 317 may ease the flow of air used to the cool the PSUs 414a to 414d over the housing 300.

In FIGS. 1-11, it should be appreciated that example embodiments provide a system that includes network elements (e.g., network switches) that provide networking functions. The system includes power supply units 414 that supply power to the network elements as well as a removable PDU 204. The PDU 204 includes a housing 300 and an input connector 216 external to the housing 300 that detachably connects with a power source that provides power for distribution by the PDU 204 to the power supply units 414. The PDU 204 further includes output connectors 320 located on the housing 300 and that provide blind-mate connection with the power supply units. For example, the output connectors 320 provide the blind-mate connection with a backplane coupled to the power supply units where each output connector 320 provides a blind-mate connection with a corresponding connector of the backplane. In one embodiment, the output connectors 320 are aligned with one another along the surface 306 (e.g., in a vertical direction in FIG. 3). The PDU 204 further includes an input 314 on the housing 300 and a power cable 220 that is hardwired to the input connector 216 and to the input 314 on the housing 300. However, example embodiments are not limited thereto, and the cable 220 and input 314 may include respective connectors to detachably connect with one another.

In view of the above, it should be appreciated that example embodiments provide a PDU 204 that includes a housing 300, an input connector 216 external to the housing 300 and that detachably connects with a power source that provides power for distribution by the PDU 204 to one or more power consuming devices, and one or more output connectors 320 located on the housing 300 that blind-mate with a backplane coupled to the one or more power consuming devices.

As should be appreciated from the instant description, PDUs or PDU modules according to example embodiments provide a compact design with cable-free connection to power consuming devices, which is useful in a networking system as the PDUs are replaceable within the larger system without shutting down and disassembling a network switch's chassis. In addition, replacement of a PDU module does not require special training or knowledge of the system and may be performed quickly and easily.

Although example embodiments have been shown and described with respect to PDUs having specific types of elements, numbers of elements, sizes elements, and/or shapes of elements, it should be appreciated inventive concepts are not limited thereto and that fewer, additional, and/or different types of elements, numbers of elements, sizes elements, and/or shapes of elements are within the scope of inventive concepts.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

It should be appreciated that inventive concepts cover any embodiment in combination with any one or more other embodiment, any one or more of the features disclosed herein, any one or more of the features as substantially disclosed herein, any one or more of the features as substantially disclosed herein in combination with any one or more other features as substantially disclosed herein, any one of the aspects/features/embodiments in combination with any one or more other aspects/features/embodiments, use of any one or more of the embodiments or features as disclosed herein. It is to be appreciated that any feature described herein can be claimed in combination with any other feature(s) as described herein, regardless of whether the features come from the same described embodiment.

Example embodiments may be configured according to the following:

(1) A power distribution unit (PDU), comprising:
 a housing;
 an input on the housing;
 an input connector coupled to the input on the housing, the input connector being connectable to a power source that provides power for distribution by the PDU to one or more power consuming devices; and
 an output including output connectors that provide blind-mate connection with a connection interface.

(2) The PDU of (1), wherein the input connector is external to the housing.

(3) The PDU of one or more of (1) to (2), further comprising:
 a power cable that couples the input connector to the input on the housing.

(4) The PDU of one or more of (1) to (3), wherein the power cable is hardwired to the input connector and the input on the housing.

(5) The PDU of one or more of (1) to (4), wherein at least some of the output connectors are aligned with one another on a surface of the housing.

(6) The PDU of one or more of (1) to (5), wherein the housing includes a protrusion, and wherein the input is located on the protrusion.

(7) The PDU of one or more of (1) to (6), wherein the input is located on a sidewall of the protrusion.

(8) The PDU of one or more of (1) to (7), further comprising: circuit breakers coupled between the input and the output, wherein the circuit breakers are externally accessible to a user.

(9) The PDU of one or more of (1) to (8), wherein the output connectors are located at a back face of the housing.

(10) The PDU of one or more of (1) to (9), wherein the back face of the housing includes an angled surface that slopes away from the output connectors in a direction toward the input on the housing.

(11) The PDU of one or more of (1) to (10), further comprising:
a controller mounted in the housing and including one or more communication interfaces externally accessible at a front face of the housing.

(12) The PDU of one or more of (1) to (11), wherein the output includes one or more auxiliary output connectors externally accessible at a front face of the housing and that provide further distribution of the power.

(13) The PDU of one or more of (1) to (12), further comprising:
one or more guides located on the housing and that facilitate the blind-mate connection with the connection interface.

(14) The PDU of one or more of (1) to (13), wherein the connection interface includes a backplane coupled to the one or more power consuming devices.

(15) A system, comprising:
network elements that provide networking functions;
power supply units that supply power to the network elements; and
a removable power distribution unit (PDU) including:
a housing;
an input connector external to the housing and that detachably connects with a power source that provides power for distribution by the PDU to the power supply units; and
output connectors located on the housing and that provide blind-mate connection with a connection interface that couples to the power supply units.

(16) The system of (15), wherein the connection interface is a backplane integrated with the power supply units.

(17) The system of one or more of (15) to (16), wherein each output connector provides a blind-mate connection with a corresponding connector of the backplane.

(18) The system of one or more of (15) to (17), wherein at least some of the output connectors are aligned with one another.

(19) The system of one or more of (15) to (18), wherein the PDU includes:
an input on the housing; and
a power cable that is hardwired to the input connector and to the input on the housing.

(20) A power distribution unit (PDU), comprising:
a housing;
an input connector external to the housing and that detachably connects with a power source that provides power for distribution by the PDU to one or more power consuming devices; and
output connectors located on the housing that blind-mate with a backplane that couples to the one or more power consuming devices.

What is claimed is:

1. A power distribution unit (PDU), comprising:
a housing;
an input on the housing;
an input connector coupled to the input on the housing, the input connector being connectable to a power source that provides power for distribution by the PDU to one or more power consuming devices; and
an output including output connectors that provide blind-mate connection with a connection interface, wherein the output connectors are located on a flat surface of the housing, and wherein the housing includes an angled surface that intersects with the flat surface and that slopes away from the flat surface in a direction toward the input on the housing.

2. The PDU of claim 1, wherein the input connector is external to the housing.

3. The PDU of claim 2, further comprising:
a power cable that couples the input connector to the input on the housing.

4. The PDU of claim 3, wherein the power cable is hardwired to the input connector and the input on the housing.

5. The PDU of claim 1, wherein at least some of the output connectors are aligned with one another on the flat surface of the housing.

6. The PDU of claim 1, wherein the housing includes a protrusion, and wherein the input is located on the protrusion.

7. The PDU of claim 6, wherein the input is located on a first sidewall of the protrusion, and wherein a second sidewall of the protrusion opposite the first sidewall is angled.

8. The PDU of claim 6, further comprising:
circuit breakers coupled between the input and the output, wherein the circuit breakers are accessible to a user and on a same surface of the housing as the protrusion.

9. The PDU of claim 6, wherein the angled surface of the housing joins the flat surface of the housing and another flat surface of the housing from which the protrusion protrudes.

10. The PDU of claim 9, wherein the output connectors protrude from the flat surface of the housing.

11. The PDU of claim 1, further comprising:
a controller mounted in the housing and including one or more communication interfaces externally accessible at a front face of the housing.

12. The PDU of claim 1, wherein the output includes one or more auxiliary output connectors externally accessible at a front face of the housing and that provide further distribution of the power.

13. The PDU of claim 1, further comprising:
one or more guides located on the housing and that facilitate the blind-mate connection with the connection interface.

14. The PDU of claim 1, wherein the connection interface includes a backplane coupled to the one or more power consuming devices.

15. A system, comprising:
network elements that provide networking functions;
power supply units that supply power to the network elements; and a removable power distribution unit (PDU) including:
- a housing;
- an input on the housing;
- an input connector external to the housing and that detachably connects with a power source that provides power for distribution by the PDU to the power supply units; and
- output connectors located on the housing and that provide blind-mate connection with a connection interface that couples to the power supply units, wherein the output connectors are located on a flat surface of the housing, and wherein the housing includes an angled surface that intersects with the flat surface and that slopes away from the flat surface in a direction toward the input on the housing.

16. The system of claim 15, wherein the connection interface is a backplane integrated with the power supply units.

17. The system of claim 16, wherein each output connector provides a blind-mate connection with a corresponding connector of the backplane.

18. The system of claim 15, wherein at least some of the output connectors are aligned with one another.

19. The system of claim 15, wherein the PDU includes:
a power cable that is hardwired to the input connector and to the input on the housing.

20. A power distribution unit (PDU), comprising:
- a housing;
- an input on the housing;
- an input connector external to the housing and that detachably connects with a power source that provides power for distribution by the PDU to one or more power consuming devices; and
- output connectors located on the housing that blind-mate with a backplane that couples to the one or more power consuming devices, wherein the output connectors are located on a flat surface of the housing, and wherein the housing includes an angled surface that intersects with the flat surface and that slopes away from the flat surface in a direction toward the input on the housing.

* * * * *